(12) United States Patent
Yoshikawa et al.

(10) Patent No.: US 12,371,610 B2
(45) Date of Patent: Jul. 29, 2025

(54) LIGHT-EMITTING ELEMENT AND METHOD FOR MANUFACTURING LIGHT-EMITTING ELEMENT

(71) Applicant: SHARP KABUSHIKI KAISHA, Sakai (JP)

(72) Inventors: Hirofumi Yoshikawa, Sakai (JP); Tatsuya Ryohwa, Sakai (JP); Masaki Yamamoto, Sakai (JP); Takahiro Doe, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 551 days.

(21) Appl. No.: 17/793,593

(22) PCT Filed: Feb. 4, 2020

(86) PCT No.: PCT/JP2020/004121
§ 371 (c)(1),
(2) Date: Jul. 18, 2022

(87) PCT Pub. No.: WO2021/156935
PCT Pub. Date: Aug. 12, 2021

(65) Prior Publication Data
US 2023/0136993 A1 May 4, 2023

(51) Int. Cl.
| | |
|---|---|
| *H10K 71/00* | (2023.01) |
| *C09K 11/02* | (2006.01) |
| *C09K 11/88* | (2006.01) |
| *H10K 50/115* | (2023.01) |
| *H10K 59/35* | (2023.01) |
| *B82Y 20/00* | (2011.01) |
| *B82Y 40/00* | (2011.01) |

(52) U.S. Cl.
CPC .......... *C09K 11/025* (2013.01); *C09K 11/883* (2013.01); *H10K 50/115* (2023.02); *H10K 59/35* (2023.02); *H10K 71/00* (2023.02); *B82Y 20/00* (2013.01); *B82Y 40/00* (2013.01)

(58) Field of Classification Search
CPC ... C09K 11/025; C09K 11/883; C09K 11/565; H10K 50/115; H10K 59/35; H10K 71/00; B82Y 20/00; B82Y 40/00; H10H 20/812; H10H 20/851; H05B 33/14
USPC .......................................... 257/40
See application file for complete search history.

(56) References Cited

U.S. PATENT DOCUMENTS

| | | | |
|---|---|---|---|
| 6,121,075 A | 9/2000 | Yamashita | |
| 6,287,928 B1 | 9/2001 | Yamashita | |
| 6,319,738 B1 | 11/2001 | Yamashita | |
| 6,673,717 B1 * | 1/2004 | Brousseau, III | H10N 99/05 257/E29.322 |
| 6,815,242 B2 * | 11/2004 | Mukai | H01L 21/02546 438/46 |
| 2002/0013037 A1 | 1/2002 | Yamashita | |
| 2002/0182658 A1 * | 12/2002 | Polak | G01N 33/54366 435/7.92 |
| 2003/0209703 A1 | 11/2003 | Yamashita | |

(Continued)

FOREIGN PATENT DOCUMENTS

JP   H1145990 A   2/1999

*Primary Examiner* — Sheikh Maruf
(74) *Attorney, Agent, or Firm* — ScienBiziP, P.C.

(57) ABSTRACT

A light-emitting element includes a light-emitting layer, and the light-emitting layer includes a plurality of quantum dots covered by shells containing a ferritin protein.

16 Claims, 7 Drawing Sheets

(56) References Cited

U.S. PATENT DOCUMENTS

| | | | | |
|---|---|---|---|---|
| 2004/0110347 | A1* | 6/2004 | Yamashita | C30B 29/605 |
| | | | | 438/286 |
| 2004/0197884 | A1* | 10/2004 | Okuda | B82Y 10/00 |
| | | | | 435/375 |
| 2005/0042386 | A1* | 2/2005 | Nunoshita | H10D 62/8181 |
| | | | | 427/523 |
| 2006/0070494 | A1* | 4/2006 | Yoshii | H10D 64/037 |
| | | | | 257/E21.21 |
| 2006/0115917 | A1* | 6/2006 | Linden | H01S 5/341 |
| | | | | 438/46 |
| 2008/0115833 | A1* | 5/2008 | Carlson | H10K 30/50 |
| | | | | 136/263 |
| 2010/0044636 | A1* | 2/2010 | Ramprasad | C09K 11/02 |
| | | | | 252/301.4 R |
| 2011/0038025 | A1* | 2/2011 | Naitou | C07K 14/47 |
| | | | | 252/301.36 |
| 2018/0013088 | A1* | 1/2018 | Zhou | H10K 59/82 |
| 2018/0019427 | A1* | 1/2018 | Kazlas | H10K 50/11 |

* cited by examiner

LIGHT-EMITTING ELEMENT AND METHOD FOR MANUFACTURING LIGHT-EMITTING ELEMENT

TECHNICAL FIELD

The disclosure relates to a light-emitting element and a method for manufacturing the light-emitting element.

BACKGROUND ART

A process step that uses ferritins in a stacking step in a light-emitting element is disclosed in Patent Literature 1. A light-emitting layer of this light-emitting element is an InGaN layer having undergone crystal growth through MOCVD. A thin film is formed firstly, iron-containing ferritins are dispersed into the thin film, and the ferritins are evaporated through heating to leave only iron. Etching is performed using the iron as a mask to process the InGaN film into a quantum-dot shape.

CITATION LIST

Patent Literature

Patent Literature 1: Japanese Unexamined Patent Application Publication No. 11-45990 (published on Feb. 16, 1999) ([0048], [0049])

SUMMARY

Technical Problem

Light-emitting elements including quantum dots need to urgently improve light emission efficiency. It is important to render quantum dots, constituting a light-emitting layer, dense in order to improve the light emission efficiency.

Further, in quantum-dot light-emitting diodes (QLEDs), efficient carrier injection into the quantum dots affects light emission efficiency considerably as well; thus, it is important that the quantum dots are close to each other.

Furthermore, improvement in in-plane unevenness in a light-emitting layer is important in large-area applications, including displays.

Solution to Problem

To solve the above problem, a light-emitting element according to one aspect of the disclosure includes at least one light-emitting layer, wherein the light-emitting layer includes a plurality of quantum dots covered by shells containing a ferritin.

To solve the above problem, a method for manufacturing a light-emitting element according to one aspect of the disclosure includes a mixture step of mixing together an apoferritin, a first metal, and a second metal different from the first metal within an alkaline solution to form a quantum dot covered by a ferritin.

Advantageous Effect of Disclosure

These aspects of the disclosure can provide a light-emitting element with light emission efficiency enhanced by densifying quantum dots and can provide a method for manufacturing such a light-emitting element.

DESCRIPTION OF EMBODIMENTS

First Embodiment

Figure 1:
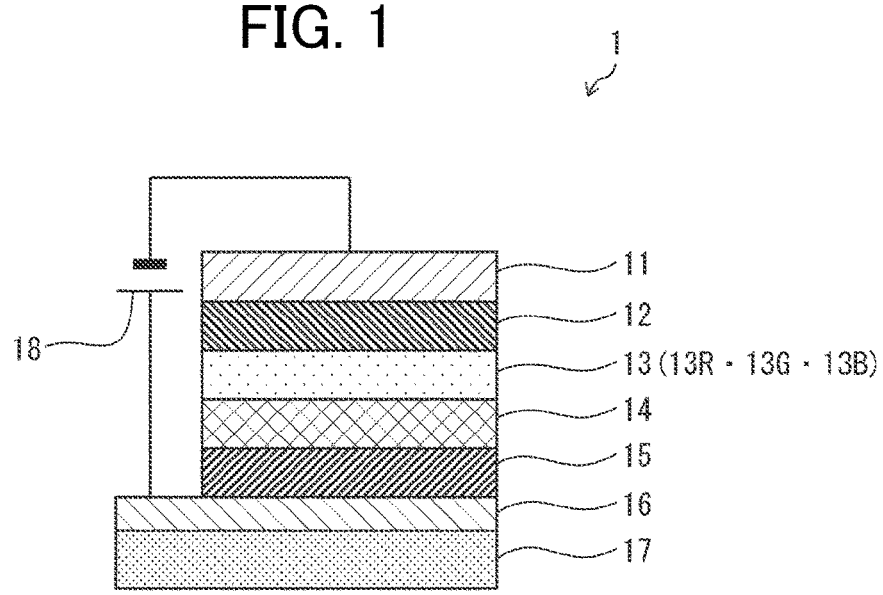
FIG. 1 illustrates a schematic configuration of a light-emitting element according to a first embodiment.

FIG. 1 illustrates a schematic configuration of a light-emitting element 1 according to a first embodiment. The light-emitting element 1 includes at least one light-emitting layer 13 and may be used as a light source of electronic equipment (e.g., a display device). Among the components included in the light-emitting element 1, the description of components irrelevant to the embodiments will be omitted. It may be understood that these omitted components are similar to publicly known components. Further, it should be noted that each drawing schematically illustrates the shape and structure of each component, and the positional relationship between the components, and that they are not necessarily drawn in conformance with their scales.

Configuration of Light-Emitting Element 1

In the light-emitting element 1, the light-emitting layer 13 is provided between a first electrode 11 and a second electrode 16, disposed opposite the first electrode 11. In this embodiment, the first electrode 11 is a negative electrode (cathode), and the second electrode 16 is a positive electrode (anode). To be more specific, the light-emitting element 1 includes the first electrode 11, an electron transportation layer (ETL) 12, the light-emitting layer 13, a hole transportation layer (HTL) 14, a hole injection layer (HIL) 15, the second electrode 16, and a substrate 17 in this order from an upward direction to a downward direction. In the Description, the direction from the second electrode 16 toward the first electrode 11 will be referred to as an upward direction. Further, the direction opposite to the upward direction will be referred to as a downward direction.

Figure 2:
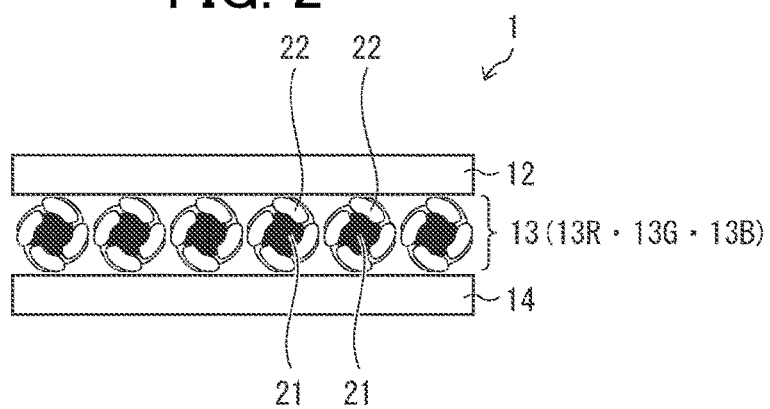
FIG. 2 is a sectional view of an electron transportation layer, a light-emitting layer, and a hole transportation layer of the light-emitting element.
Figure 3:
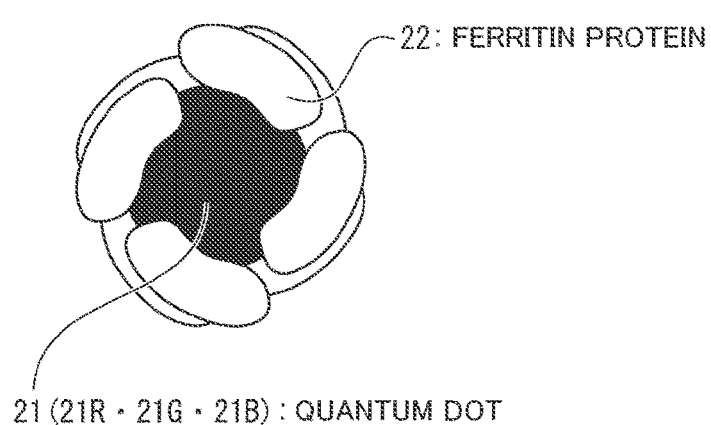
FIG. 3 is a perspective view of a ferritin containing a quantum dot formed in the light-emitting layer.
Figure 4:
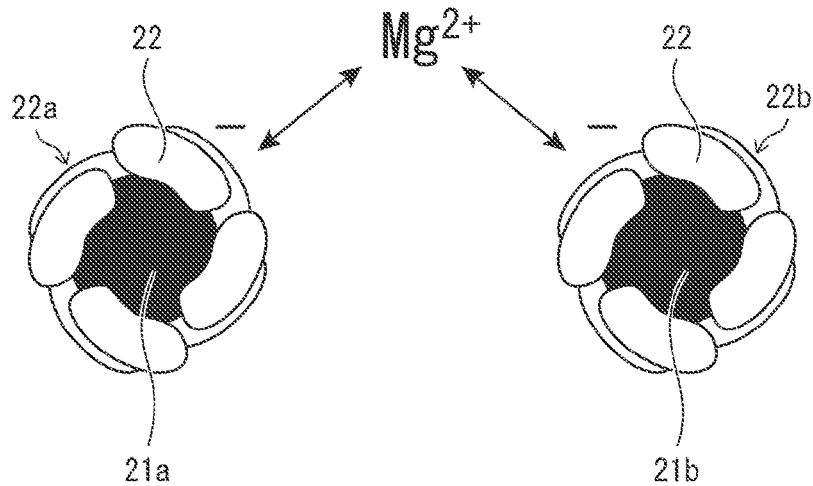
FIG. 4 illustrates the relationship between ferritins containing the quantum dot and a cationic metal.

FIG. 2 is a sectional view of the electron transportation layer 12, light-emitting layer 13, and hole transportation layer 14 of the light-emitting element 1. FIG. 3 is a perspective view of a ferritin protein 22 containing a quantum dot 21 formed in the light-emitting layer 13. FIG. 4 illustrates the relationship between ferritin proteins 22 containing quantum dots 21 and 21b and a cationic metal.

The light-emitting layer 13 includes a plurality of quantum dots 21. Each quantum dot 21 is covered by a shell containing the ferritin protein 22 (hereinafter, also merely referred to as a ferritin).

The quantum dot 21 is a light-emitting material that has a valence band level and a conduction band level, and that emits light upon rejoining of holes at the valence band level and electrons at the conduction band level together. To be more specific, electrons injected from the electron transportation layer 12 into the quantum dot 21 and holes injected from the hole transportation layer 14 into the quantum dot 21 join together, thus causing the quantum dot 21 to emit light of a predetermined wavelength band.

The quantum dot 21 is preferably a particle with low dispersibility of visible light. The quantum dot 21 is preferably at least one semiconductor material selected from the group consisting of CdS, CdSe, CdTe, ZnS, ZnSe, ZnTe, InN, InP, InAs, InSb, AlP, AlS, AlAs, AlSb, GaN, GaP, GaAs, GaSb, PbS, PbSe, Si, Ge, MgS, MgSe, and MgTe and of combinations thereof. To be more specific, nanosized crystals of the foregoing semiconductor material (semiconductor crystals) are used as the material of the quantum dot 21.

The quantum dot 21 may be a binary-core type, a tertiary-core type, a quaternary-core type, a core-shell type, or a core-multi shell type. Further, the quantum dot 21 may be a doped quantum dot or a slanted quantum dot.

The ferritin protein 22 is in the form of a substantially spherical shell and has a basket shape incorporating the quantum dot 21 into the spherical shell. The spherical shell of the ferritin protein 22 incorporates a joining site joined with the element contained in the quantum dot 21 by electrostatic attractive force.

A specific example of the ferritin protein 22 is a recombinant horse-origin ferritin. Other examples include human- and rat-origin ferritins. The fundamental structure of the ferritin proteins 22 is almost common, with an outer diameter of 12 nm and an inner diameter of 7 nm. The inner diameter of the ferritin protein 22 is characteristically determined by the kind of the ferritin protein 22 and has an inner diameter of 4 to 8 nm inclusive. It is noted that a small protein called *Listeria* bacteria-origin Dps protein is classified as one of the ferritin protein 22 and has an outer diameter of 9 nm and an inner diameter of 4.5 nm.

The thickness of the ferritin protein 22, which is a value obtained by subtracting its inner-diameter size from its outer-diameter size, measures about 5 nm. The ferritin protein 22 is only about 5 nm thick, as described above, and thus, electrons and holes are injected into the quantum dot 21 contained in the ferritin protein 22, through a tunnel effect, hopping conduction, or other things.

The ferritin protein 22 is a protein that voluntarily forms an order structure through interaction. Thus, the quantum dot 21 contained in the ferritin protein 22 is regularly disposed within the light-emitting layer 13 by the self-assembly of the ferritin protein 22. Consequently, the quantum dot 21 included in the light-emitting layer 13 is rendered more dense than a known quantum dot 21 with coordinating ligands. Further, the quantum dot 21 can be prevented from overlapping in the stacking direction within the light-emitting layer 13, thereby improving the efficiency of electron and hole injection into the quantum dot 21, thus improving the light emission efficiency of the quantum dot 21. Further, the quantum dot 21 is disposed regularly in a plane direction, thus improving the in-plane unevenness of light emitted from the light-emitting layer 13.

Further, the light-emitting layer 13 may contain a bivalent cationic metal. The light-emitting layer 13 contains a bivalent cationic metal, thus, with regard to the two quantum dots 21a and 21b, a shell 22a, covering one of the quantum dots 21a, and a shell 22b, covering the other quantum dot 21b, are joined together via a bivalent cationic metal ion, as illustrated in FIG. 4. There is a joining site also outside each of the shell 22a and 22b containing the ferritin protein 22. When a bivalent cationic metal ion is joined to this joining site, a thing like a salt bridge is formed between the ferritin proteins 22, thus enabling the adjacent ferritin proteins 22 to be coupled together further firmly. This enables the quantum dot 21 within the light-emitting layer 13 to be dense. Achieving the quantum dot 21 having high density can improve the color purity of light emitted from the light-emitting layer 13.

The metal element constituting the bivalent cationic metal is selected from Cd, Zn, Ca, and Mg.

The wavelength of light emitted from the light-emitting layer 13 is controlled by the composition or particle diameter of the quantum dot 21. The particle diameter of the quantum dot 21 is controlled by changing the composition of the ferritin protein 22 and controlling the inner diameter of the spherical shell of the ferritin protein 22.

At least one of the first electrode 11 and the second electrode 16 is a light-transparency electrode that allows light emitted from the light-emitting layer 13 to pass. The substrate 17 may be composed of a light-transparency material or may be composed of a light-reflective material.

In the first embodiment, the first electrode 11 is composed of an indium tin oxide (ITO) for instance. That is, the first electrode 11 is composed as a light-transparency electrode. The second electrode 16 is composed of aluminum (Al) for instance. That is, the second electrode 16 is composed as a reflective electrode that reflects light emitted from the light-emitting layer 13.

This configuration enables light emitted from the light-emitting layer 13 and traveling downward to be reflected by the second electrode 16. This enables light reflected by the second electrode 16 to travel toward the first electrode 11 (upward). As such, the light-emitting element 1 enables light emitted from the light-emitting layer 13 to exit mainly upward. That is, the light-emitting element 1 is configured as a top-emission type.

However, the light-emitting element 1 may be configured to allow light emitted from the light-emitting layer 13 to exit mainly downward. For instance, the first electrode 11 may be configured as a reflective electrode, and the second electrode 16 may be configured as a light-transparency electrode. As such, the light-emitting element 1 is configured as a bottom-emission type. When the light-emitting element 1 is a bottom-emission type, the substrate 17 is composed of a light-transparency material. Alternatively, the light-emitting element 1 may be configured to allow light emitted from the light-emitting layer 13 to exit both upward and downward. That is, the light-emitting element 1 may be configured as a dual-light-emission type.

The electron transportation layer 12 contains a material with a high electron transport capability. The electron transportation layer 12 also preferably inhibits hole transport. The electron transportation layer 12 contains ZnO nanoparticles for instance. The electron transportation layer 12 may serve also as an electron injection layer (EIL) that promotes electron injection from the first electrode 11 into the light-emitting layer 13.

The hole injection layer 15 promotes hole injection from the second electrode 16 into the light-emitting layer 13. The hole injection layer 15 contains poly (3,4-ethylenedioxythiophene):poly(4-styrenesulfonic acid) (PEDOT:PSS) for instance.

The hole transportation layer 14 contains a material with a high hole transport capability. The hole transportation layer 14 contains a substance, such as polyvinylcarbazole (PVK) or nickel oxide. The hole transportation layer 14 may serve also as a hole injection layer.

Applying a forward voltage between the second electrode 16 (anode) and the first electrode 11 (cathode) by using a power source 18 (rendering the second electrode 16 as higher potential than the first electrode 11) enables (i) electron supply from the first electrode 11 to the light-emitting layer 13 and (ii) hole supply from the second electrode 16 to the light-emitting layer 13. This enables the light-emitting layer 13 to generate light upon hole and electron joining. Voltage application using the power source 18 may be controlled by a thin-film transistor (TFT) not shown.

Method for Manufacturing Light-Emitting Element 1

Figure 5:
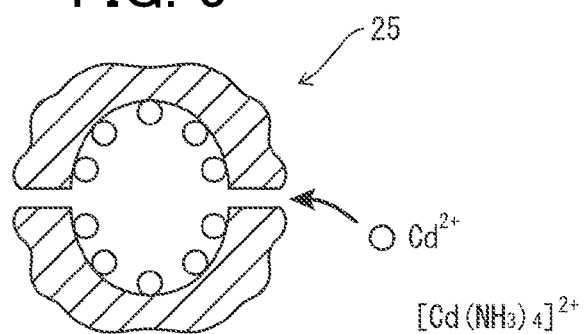
FIG. 5 is a sectional view for describing a mixture step in a method for manufacturing the light-emitting element.
Figure 6:
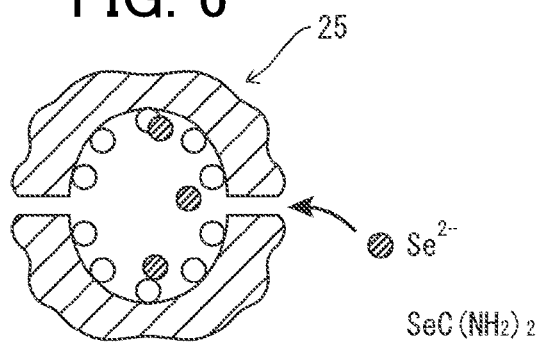
FIG. 6 is another sectional view for describing the mixture step in the method for manufacturing the light-emitting element.
Figure 7:
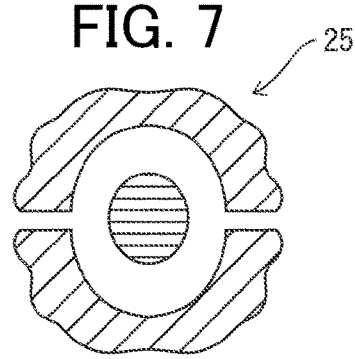
FIG. 7 is further another sectional view for describing the mixture step in the method for manufacturing the light-emitting element.
Figure 8:
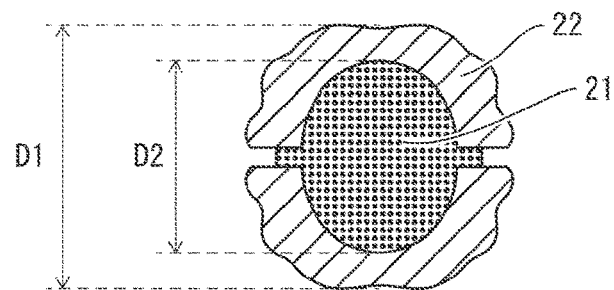
FIG. 8 is still another sectional view of the mixture step in the method for manufacturing the light-emitting element.
Figure 9:
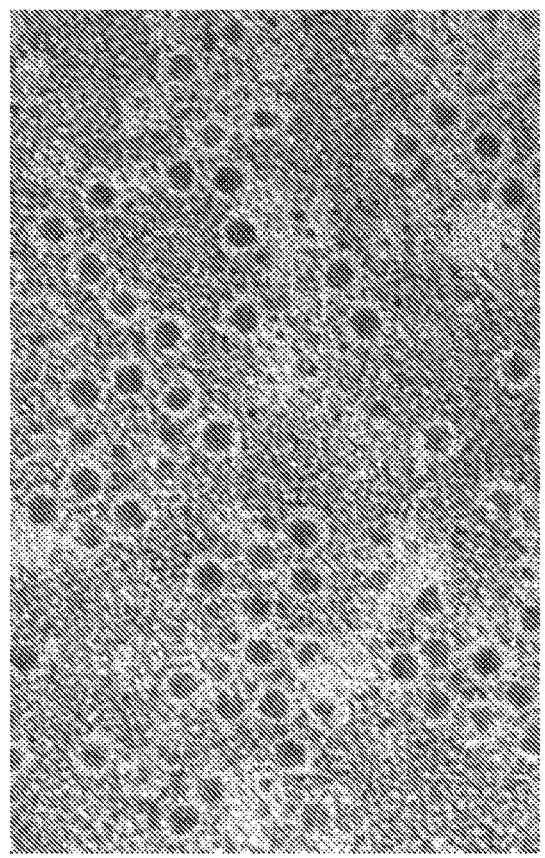
FIG. 9 is a photograph for describing the mixture step in the method for manufacturing the light-emitting element.
Figure 10:
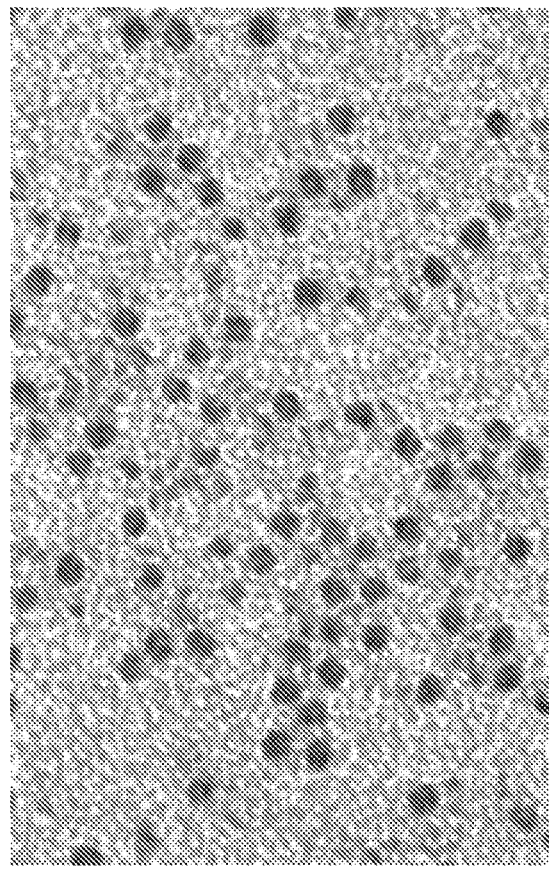
FIG. 10 is another photograph for describing the mixture step in the method for manufacturing the light-emitting element.

FIG. 5 is a sectional view for describing a mixture step in a method for manufacturing the light-emitting element 1. FIG. 6 is another sectional view for describing the mixture step. FIG. 7 and FIG. 8 are further other sectional views for describing the mixture step. FIG. 9 is a photograph for describing the mixture step. FIG. 10 is another photograph for describing the mixture step. It is noted that these drawings are cited from http://www.science-plaza.or.jp/about/sankangaku/forum13/yamasita.pdf.

The method for manufacturing the light-emitting element 1 includes a mixture step, i.e., mixing together an apoferritin 25, a first metal, and a second metal, different from the first metal, within an alkaline solution to form the quantum dot (QD phosphor particle) 21 covered by the ferritin protein 22.

The first metal is preferably Cd. The second metal preferably contains at least one selected from Zn, Se, and Te.

In the mixture step, a sample containing 0.5 mg/ml of the apoferritin 25, which is a ferritin source, 1 to 3M of $CH_3COOH$, which is a Cd source, 40 mM of selenourea, which is a Se source, an ammonia aqueous solution, which is a solvent, and 40 mM of $CH_3COONH_4$, which is a $Cd_2$+complex ion forming agent is put into a beaker and stirred with a stirrer all night. Accordingly, the ferritin protein 22 containing the quantum dot 21 consisting of CdSe is synthesized.

Figure 11:
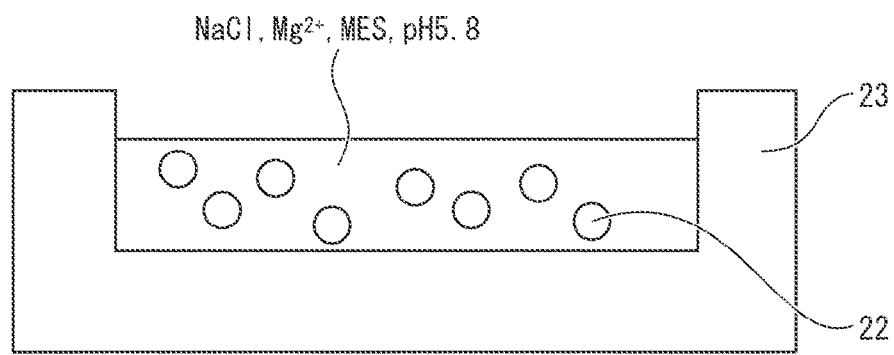
FIG. 11 is a sectional view for describing a stacking step in the method for manufacturing the light-emitting element.
Figure 12:
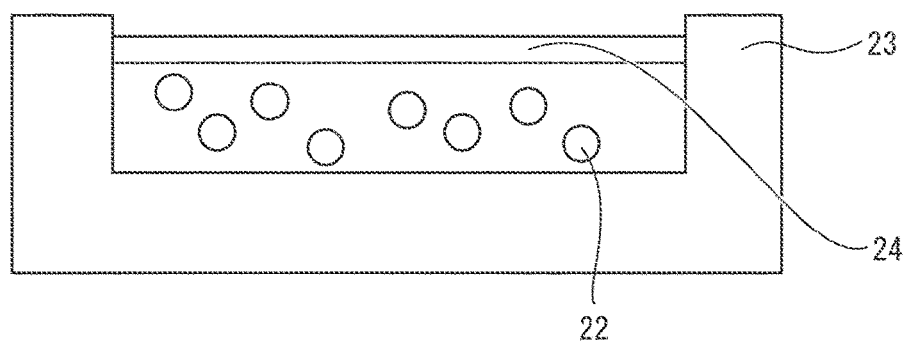
FIG. 12 is another sectional view for describing the stacking step in the method for manufacturing the light-emitting element.

FIG. 11 is a sectional view for describing a stacking step in the method for manufacturing the light-emitting element 1. FIG. 12 is another sectional view for describing the stacking step.

In the stacking step, the ferritin proteins 22 containing the quantum dots 21 undergo arrangement through a polypeptide method (PBLH method).

Firstly, the stacking step includes a process step of forming a first mixed liquid by mixing, into a liquid, the quantum dot 21 covered by the shell 22a or 22b containing the ferritin protein 22 obtained in the mixture step. To be specific, 20-40 μg/ml of the CdSe-containing ferritin obtained in the mixture step, a Mg ion, which is a bivalent cation, 20 mM of a NaCl in the form of a liquid, and 2-(4-Morpholino) ethanesulfonic acid (MES) (a pH of 5.8, 20 mM), which is a buffer material, are mixed together in a Teflon (registered trademark) trough 23, as illustrated in FIG. 11.

Next, poly-1-benzyl-L-histidine (PBLH) in the form of a protein solution is injected into the interface of this mixed solution to obtain a second mixed liquid. PBLH loses 3D conformation due to the surface tension of an air-liquid interface to form, as illustrated in FIG. 12, a PBLH film 24 composed of a denatured protein film.

Figure 13:
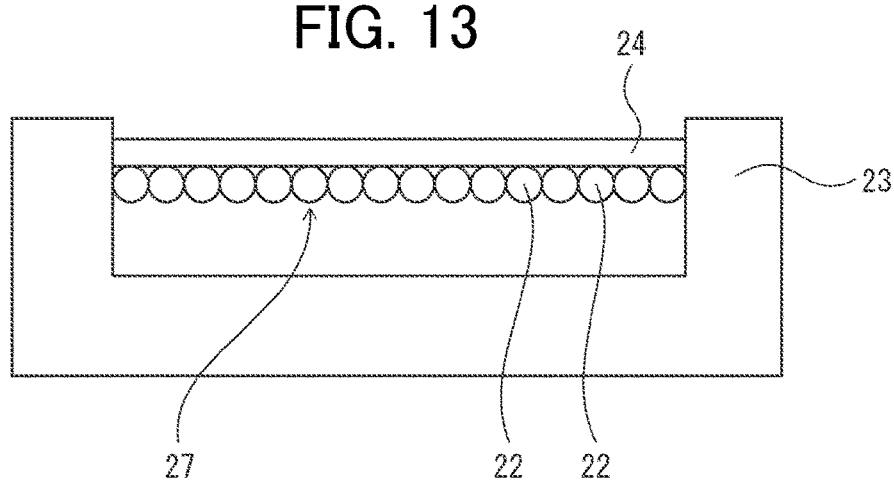
FIG. 13 is a sectional view for describing a transfer step in the method for manufacturing the light-emitting element.

Thereafter, a burning step at about 38° C. can efficiently obtain a two-dimensional arrangement 27 of the ferritin proteins 22, as illustrated in FIG. 13, through the electrostatic interaction between the PBLH film 24 and the ferritin protein 22 while producing two-dimensional crystals through a self-assembly ability inherently provided with the ferritin protein 22. To be specific, the ferritin protein 22 has a portion called a metal-joining site, where upon joining of a bivalent cationic ion, a thing like a salt bridge is formed between the ferritin proteins 22, thus enabling the ferritin proteins 22 to be joined together firmly.

Figure 14:
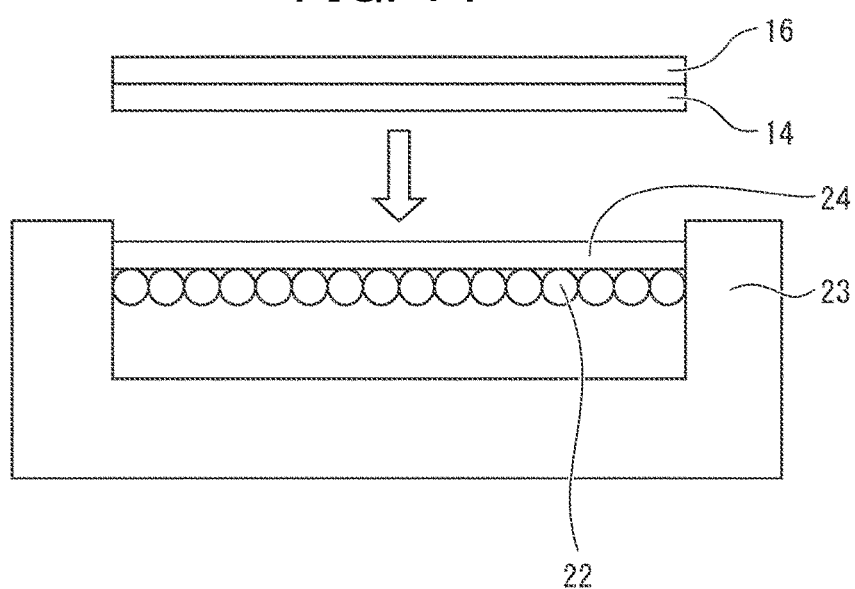
FIG. 14 is another sectional view for describing the transfer step in the method for manufacturing the light-emitting element.

Then, as illustrated in FIG. 14, a substrate rendered hydrophobic with the hole transportation layer 14 stacked on the second electrode 16 (anode) is prepared in advance and floated onto a solution with the PBLH film 24 thereon, to attach the PBLH film 24 with the ferritin protein 22 thereon onto the substrate, thus stacking the ferritin protein 22. Alternatively, only the ferritin protein 22 may be stacked onto the hole transportation layer 14 by preparing, in advance, another substrate rendered hydrophobic and then floating the other substrate onto a solution with the PBLH film 24 thereon, to attach the PBLH film 24 with the ferritin protein 22 thereon onto the other substrate, followed by a transfer step, where the ferritin protein 22 on the PBLH film 24 undergoes transfer onto a substrate with the hole transportation layer 14 on the top through a transfer method using a van der Waals force or other methods.

Stacking, with a known method, the electron transportation layer 12 and the first electrode 11 onto the light-emitting layer 13 produced through the foregoing steps can manufacture the light-emitting element 1.

The quantum dot 21 may be formed without Cd. The ferritin protein 22 containing the quantum dot 21 consisting of ZnSe can be produced by using a slow chemical reaction. To be specific, the ferritin protein 22 containing the quantum dot 21 consisting of ZnSe is obtained by coordinating ammonia with a Zn ion to form a tetraammine complex, followed by adding selenourea to supply a Se ion.

Next, the light-emitting layer 13 is formed by using the ferritin protein 22 containing the quantum dot 21. To be specific, a PBLH method can form a two-dimensional crystalline film. A solution with the ferritin protein 22, a Ca ion, which is a bivalent cation, and NaCl mixed into MES, which is a buffer agent, is filled into a Teflon (registered trademark)

trough. Then, forming a thin film by dropping poly-1-benzyl-L-histidine (PBLH), which is artificial polypeptide, onto this solution, thus allowing the ferritin protein 22 to electrostatically adhere directly under the PBLH film. The in-plan direction of the ferritin protein 22 enables a ferritin two-dimensional crystalline film to be obtained by joining together of metal-joining sites. Thereafter, transfer onto a substrate with a stack of an electrode and a carrier transportation layer via another substrate obtains the light-emitting layer 13 (similar to that in FIG. 1). Alternatively, the light-emitting layer 13 may be rendered as a stack of multiple layers.

Modification

A display device according to a modification of the disclosure may be a display device having a display region in which the light-emitting element in the first embodiment that emits red light (hereinafter, a red light-emitting element), the light-emitting element in the first embodiment that emits green light (hereinafter, a green light-emitting element), and the light-emitting element in the first embodiment that emits blue light (hereinafter, a blue light-emitting element) are arranged in matrix.

A red light-emitting layer 13R included in the red light-emitting element, a green light-emitting layer 13G included in the green light-emitting element, and a blue light-emitting layer 13B included in the blue light-emitting element include quantum dots 21R, 21G and 21B corresponding to the respective colors of emitted light and include the ferritin protein 22 (FIG. 2 and FIG. 3).

When the ferritin protein 22 is a recombinant horse-origin ferritin for instance, CdZnSe-based, CdSSe-based, and CdZnTe-based quantum dot materials can be used for the quantum dots 21R and the quantum dot 21G, and further, CdZnSe-based and CdSSe-based quantum dot materials can be used for the quantum dot 21B.

Table 1 below shows, for each colored light-emitting layer, specific example combinations of the composition of the ferritin protein 22 and the composition and particle diameter of each of the quantum dots 21R, 21G, and 21B.

TABLE 1

| | | | | | Calculations (For reference) |
|---|---|---|---|---|---|
| Example 1 | R light-emitting layer | QD | Composition | $Cd_{0.9}Zn_{0.1}Se$ | 635 nm |
| | | | Particle diameter | 7 nm | |
| | | Ferritin | Composition | Recombinant horse-origin ferritin (Inner diameter of 7 nm) | |
| | G light-emitting layer | QD | Composition | $Cd_{0.5}Zn_{0.5}Se$ | 528 nm |
| | | | Particle diameter | 7 nm | |
| | | Ferritin | Composition | Recombinant horse-origin ferritin (Inner diameter of 7 nm) | |
| | B light-emitting layer | QD | Composition | $Cd_{0.25}Zn_{0.75}Se$ | 468 nm |
| | | | Particle diameter | 7 nm | |
| | | Ferritin | Composition | Recombinant horse-origin ferritin (Inner diameter of 7 nm) | |
| Example 2 | R light-emitting layer | QD | Composition | $Cd_{0.85}Zn_{0.15}Te$ | 633 nm |
| | | | Particle diameter | 7 nm | |
| | | Ferritin | Composition | Recombinant horse-origin ferritin (Inner diameter 7 nm) | |
| | G light-emitting layer | QD | Composition | $Cd_{0.3}Zn_{0.7}Te$ | 536 nm |
| | | | Particle diameter | 7 nm | |
| | | Ferritin | Composition | Recombinant horse-origin ferritin (Inner diameter of 7 nm) | |
| | B light-emitting layer | QD | Composition | $Cd_{0.25}Zn_{0.75}Se$ | 468 nm |
| | | | Particle diameter | 7 nm | |
| | | Ferritin | Composition | Recombinant horse-origin ferritin (Inner diameter of 7 nm) | |
| Example 3 | R light-emitting layer | QD | Composition | $CdS_{0.15}Se_{0.85}$ | –630 nm |
| | | | Particle diameter | 7 nm | |
| | | Ferritin | Composition | Recombinant horse-origin ferritin (Inner diameter of 7 nm) | |
| | G light-emitting layer | QD | Composition | $CdS_{0.65}Se_{0.35}$ | –532 nm |
| | | | Particle diameter | 7 nm | |
| | | Ferritin | Composition | Recombinant horse-origin ferritin (Inner diameter of 7 nm) | |
| | B light-emitting layer | QD | Composition | $CdS_{0.95}Se_{0.05}$ | –467 nm |
| | | | Particle diameter | 7 nm | |
| | | Ferritin | Composition | Recombinant horse-origin ferritin (Inner diameter of 7 nm) | |

TABLE 1-continued

| | | | | Calculations (For reference) |
|---|---|---|---|---|
| Example 4 | R light-emitting layer | QD | Composition: Cd0.85Zn0.15Te<br>Particle diameter: 7 nm | 633 nm |
| | | Ferritin | Composition: Recombinant horse-origin ferritin (Inner diameter of 7 nm) | |
| | G light-emitting layer | QD | Composition: Cd0.3Zn0.7Te<br>Particle diameter: 7 nm | 536 nm |
| | | Ferritin | Composition: Recombinant horse-origin ferritin (Inner diameter of 7nm) | |
| | B light-emitting layer | QD | Composition: CdS0.95Se0.05<br>Particle diameter: 7 nm | −467 nm |
| | | Ferritin | Composition: Recombinant horse-origin ferritin (Inner diameter of 7 nm) | |

Figure 15:
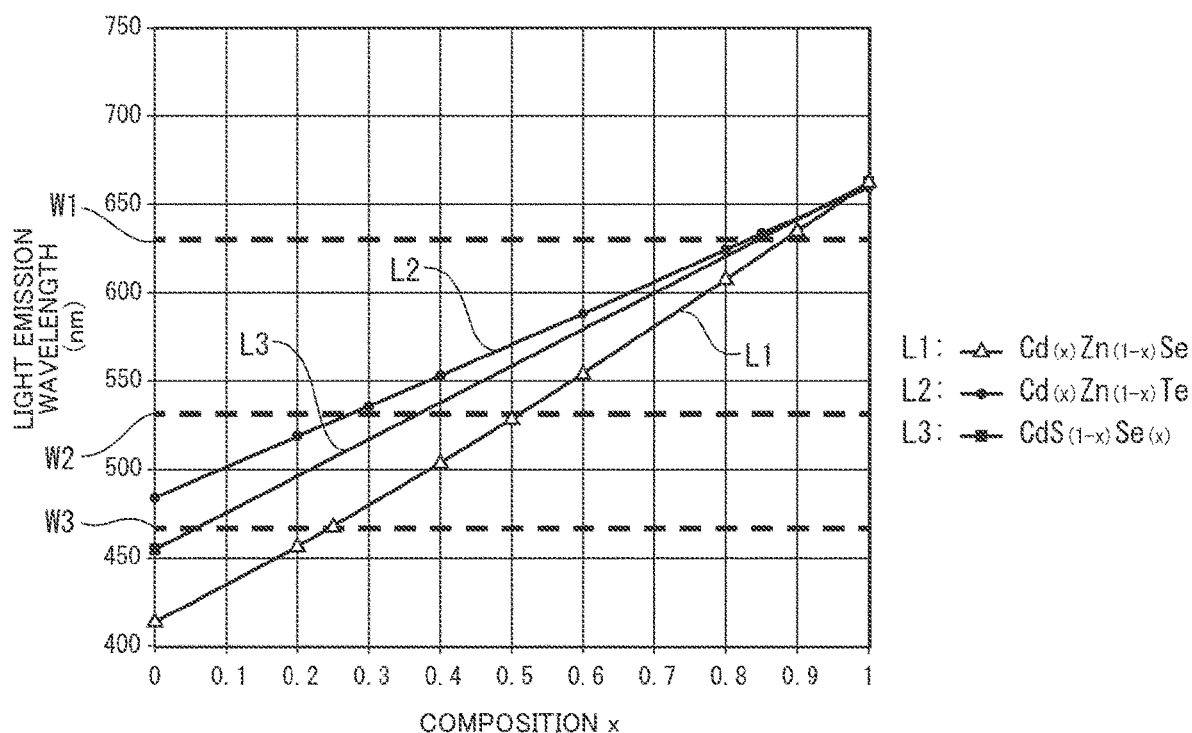
FIG. 15 is a graph showing the relationship between the composition of the light-emitting element and light emission wavelength.

FIG. 15 is a graph showing the relationship between the composition of the light-emitting element 1 and light emission wavelength. The lateral axis denotes the composition, x, of the quantum dot 21 included in the light-emitting layer 13, and the longitudinal axis denotes the wavelength of light emitted by the light-emitting layer 13 including the quantum dot 21 of the composition x. Wavelength W1 indicates the wavelength of red light, wavelength W2 indicates the wavelength of green light, and wavelength W3 indicates the wavelength of blue light.

Line L1 denotes the relationship between the composition x of the quantum dot 21, which is included in the light-emitting layer 13, expressed by $Cd_xZn_{(1-x)}Se$ and the wavelength of light emitted by the light-emitting layer 13 and corresponds to Expression (1), Expression (2), and Expression (3), which will be described later on. Line L2 denotes the relationship between the composition x of the quantum dot 21 expressed by $Cd_xZn_{(1-x)}Te$ and the wavelength of light emitted by the light-emitting layer 13 and corresponds to Expression (7) and Expression (8), which will be described later on. Line L3 denotes the relationship between the composition x of the quantum dot 21 expressed by $CdS_{(1-x)}Se_x$ and the wavelength of light emitted by the light-emitting layer 13 and corresponds to Expression (4), Expression (5) and Expression (6), which will be described later on.

Provided are reference calculations of the light emission wavelength with the quantum dot 21 having a diameter of 7 nm. To be specific, the quantum levels of conduction and valence bands are calculated by solving the single-band Schrödinger equation. $CdS_{(1-x)}Se_x$, denoted by the line L3, is calculated using the interpolation line between two points and is assumed to be able to undergo liner interpolation similarly to the other materials.

To be more specific, the quantum dot 21R based on CdZnSe is expressed by Expression (1), the quantum dot 21G based on CdZnSe is expressed by Expression (2), and the quantum dot 21B based on CdZnSe is expressed by Expression (3).

$$Cd_{x1}Zn_{(1-x1)}Se \quad (1)$$

$$Cd_{x2}Zn_{(1-x2)}Se \quad (2)$$

$$Cd_{x3}Zn_{(1-x3)}Se \quad (3)$$

Here, $0.1<x3<x2<x1<1.0$ is preferably satisfied, furthermore, $0.4<x2<x1<1.0$ is preferably satisfied, and $0.1<x3<0.4$ is preferably satisfied.

To be more specific, the quantum dot 21R based on CdSSe is expressed by Expression (4), the quantum dot 21G based on CdSSe is expressed by Expression (5), and the quantum dot 21B based on CdSSe is expressed by Expression (6).

$$CdS_{(1-x1)}Se_{x1} \quad (4)$$

$$CdS_{(1-x2)}Se_{x2} \quad (5)$$

$$CdS_{(1-x3)}Se_{x3} \quad (6)$$

Here, $0<x3<x2<x1<1.0$ is preferably satisfied, furthermore, $0.2<x2<x1<1.0$ is preferably satisfied, and $0<x3<0.2$ is preferably satisfied.

To be more specific, the quantum dot 21R based on CdZnTe is expressed by Expression (7), and the quantum dot 21G based on CdZnTe is expressed by Expression (8).

$$Cd_{x1}Zn_{(1-x1)}Te \quad (7)$$

$$Cd_{x2}Zn_{(1-x2)}Te \quad (8)$$

Here, $0.1<x2<x1<1.0$ is preferably satisfied.

Alternatively, the colors of light emitted from the respective red light-emitting layer 13R, green light-emitting layer 13G and blue light-emitting layer 13B may be controlled by changing the inner diameter of the ferritin protein 22 contained in the individual red light-emitting layer 13R, green light-emitting layer 13G and blue light-emitting layer 13B.

Further, the inner diameter of the ferritin protein 22 contained in the red light-emitting layer 13R is preferably larger than at least one of the inner diameter of the ferritin protein 22 contained in the green light-emitting layer 13G and the inner diameter of the ferritin protein 22 contained in the blue light-emitting layer 13B. Further, the inner diameter of the ferritin protein 22 contained in the green light-emitting layer 13G is preferably larger the inner diameter of the ferritin protein 22 contained in the blue light-emitting layer 13B.

It is noted that the outer diameter of the ferritin protein 22 is denoted as D1 shown in FIG. 8, and the inner diameter of the ferritin protein 22 is denoted as D2 shown in FIG. 8. It is noted that the quantum dot 21, which grows to the inside of the spherical shell of the ferritin protein 22, has a particle diameter approximately close to the inner diameter D2 of the ferritin protein 22.

Second Embodiment

The first embodiment has disclosed the light-emitting element 1, which includes the light-emitting layer 13 that emits light through injection-type electric-field light emission, whereas a second embodiment discloses a light-emitting element 1A, which includes a light-emitting layer that emits light through electric-field light emission and includes a plurality of wavelength conversion layers that are individually disposed adjacently to the light-emitting layer from which light exits, and that convert the wavelength of light emitted from the light-emitting layer. It is noted that the detailed description of configurations common to those of the light-emitting element 1 in the first embodiment will be omitted.

Figure 16:
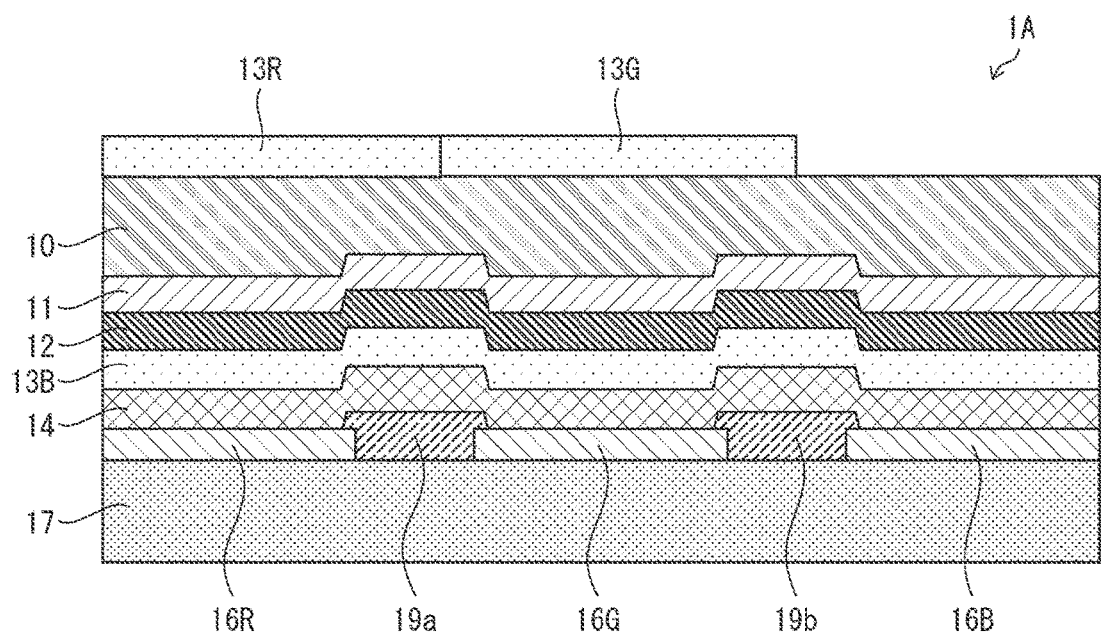
FIG. 16 illustrates a schematic configuration of a light-emitting element according to a second embodiment.
Figure 17:
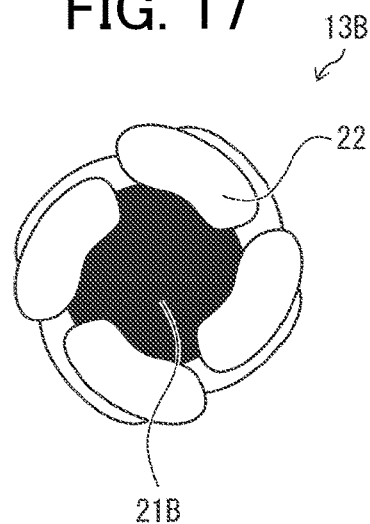
FIG. 17 is a perspective view of a ferritin containing a quantum dot formed in a light-emitting layer of the light-emitting element.
Figure 18:
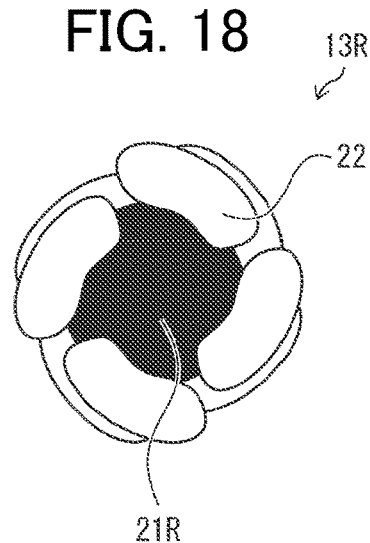
FIG. 18 is a perspective view of a ferritin containing a quantum dot formed in another light-emitting layer of the light-emitting element.
Figure 19:
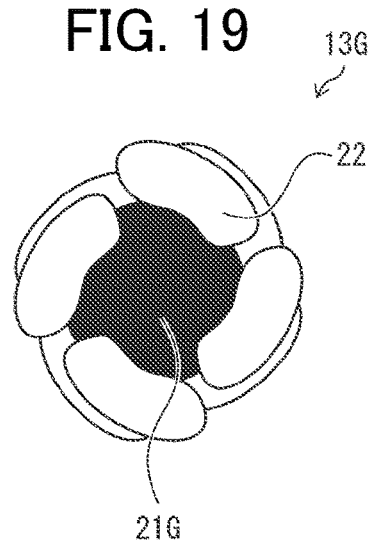
FIG. 19 is a perspective view of a ferritin containing a quantum dot formed in further another light-emitting layer of the light-emitting element.

FIG. 16 illustrates a schematic configuration of the light-emitting element 1A in the second embodiment. FIG. 17 is a perspective view of a ferritin protein 22 containing a quantum dot 21B formed in a blue light-emitting layer 13B of the light-emitting element 1A. FIG. 18 is a perspective view of a ferritin protein 22 containing a quantum dot 21R formed in a red light-emitting layer 13R of the light-emitting element 1A. FIG. 19 is a perspective view of a ferritin protein 22 containing a quantum dot 21G formed in a green light-emitting layer 13G of the light-emitting element 1A. The description of components included in the light-emitting element 1A that are irrelevant to the second embodiment and the description of which overlaps that in the first embodiment will be omitted.

Configuration of Light-Emitting Element 1A

In the light-emitting element 1A, the blue light-emitting layer 13B is provided between a first electrode 11 and each of second electrodes 16R, 16G and 16B. The second electrodes 16R, 16G, and 16G are spaced from each other by edge covers 19a and 19b and disposed on a substrate 17. The first electrode 11 functions as a cathode, and the second electrodes 16R, 16G, and 16B each function as an anode. A sealing layer 10 is stacked over the first electrode 11. Furthermore, over the sealing layer 10, the red light-emitting layer 13R and the green light-emitting layer 13G are individually stacked on the sealing layer 10 as wavelength conversion layers.

The blue light-emitting layer 13B includes the quantum dot 21B that is covered with the ferritin protein 22 and that emits blue light. This quantum dot 21B, which emits blue light, can be composed of the quantum dot 21B that is disclosed in the modification of the first embodiment and that emits blue light.

The sealing layer 10 is stacked on the first electrode 11 and is made of a material that allows light emitted by the blue light-emitting layer 13B to pass. The material constituting the sealing layer 10 is selected as appropriate from materials that are common in the field.

The red light-emitting layer 13R is stacked in a position being adjacent to the blue light-emitting layer 13B from which light exits, and overlapping the blue light-emitting layer 13B above the sealing layer 10. The red light-emitting layer 13R converts the optical wavelength of blue light emitted from the blue light-emitting layer 13B into red and includes the quantum dot 21R that emits red light. This quantum dot 21R can be composed of the quantum dot 21R that is disclosed in the modification of the first embodiment and that emits red light. The quantum dot 21R may be covered with the ferritin protein 22.

The green light-emitting layer 13G is stacked in a position overlapping the blue light-emitting layer 13B above the sealing layer 10 positioned adjacently to the blue light-emitting layer 13B from which light exits. The green light-emitting layer 13G converts the optical wavelength of blue light emitted from the blue light-emitting layer 13B into green and includes the quantum dot 21G that emits green light. This quantum dot 21G can be composed of the quantum dot 21G that is disclosed in the modification of the first embodiment and that emits green light. The quantum dot 21G may be covered with the ferritin protein 22.

Upon voltage application between the first electrode 11 and the second electrode 16R, the quantum dot 21B included in part of the blue light-emitting layer 13B overlapping the second electrode 16R undergoes excitation to emit blue light through electric-field light emission. The blue light emitted from the part of the blue light-emitting layer 13B passes through the sealing layer 10 and enters the red light-emitting layer 13R on the sealing layer 10. Then, the quantum dot 21R included in the red light-emitting layer 13R undergoes optical excitation by the blue light entered the red light-emitting layer 13R, to thus emit red light.

Upon voltage application between the first electrode 11 and the second electrode 16G, the quantum dot 21B included in part of the blue light-emitting layer 13B overlapping the second electrode 16G undergoes excitation to emit blue light through electric-field light emission. The blue light emitted from the part of the blue light-emitting layer 13B passes through the sealing layer 10 and enters the green light-emitting layer 13G on the sealing layer 10. Then, the quantum dot 21G included in the green light-emitting layer 13G undergoes optical excitation by the blue light entered the green light-emitting layer 13G, to thus emit green light.

Upon voltage application between the first electrode 11 and the second electrode 16B, the quantum dot 21B included in part of the blue light-emitting layer 13B overlapping the second electrode 16B undergoes excitation to emit blue light through electric-field light emission. The blue light emitted from the part of the blue light-emitting layer 13B passes through the sealing layer 10 and exits from a part of the surface of the sealing layer 10 overlapping the second electrode 16B.

The blue light-emitting layer 13B, the red light-emitting layer 13R, and the green light-emitting layer 13G respectively include the quantum dots 21B, 21R, and 21G containing the ferritin protein 22; accordingly, the self-assembly function of the ferritin protein 22 renders the quantum dots 21R, 21G, and 21B close to each other within each of the red light-emitting layer 13R, the green light-emitting layer 13G, and the blue light-emitting layer 13B. As a result, the red light-emitting layer 13R, the green light-emitting layer 13G, and the blue light-emitting layer 13B are rendered denser than a known configuration having ligands and quantum dots 21, thus improving the light emission efficiency of the light-emitting element 1A. Further, the above configuration improves in-plane unevenness in the red light-emitting layer 13R, the green light-emitting layer 13G, and the blue light-emitting layer 13B further than a known configuration having ligands and QD phosphor particles 21.

Further, the red light-emitting layer 13R, the green light-emitting layer 13G, and the blue light-emitting layer 13B may each contain the foregoing bivalent cationic metal, like those in the first embodiment.

It is noted that a color filter for emitting light of a desired wavelength may be provided individually above the red light-emitting layer 13R and above the green light-emitting layer 13G as well as above a part of a surface of the sealing layer 10 from which blue light is emitted, depending on various intentions.

Method for Manufacturing Light-Emitting Element 1A A method for manufacturing the light-emitting element 1A includes the manufacturing method disclosed in the first embodiment and includes thereafter, preparing a stack of the substrate 17 through the first electrode 11, and further stacking the sealing layer 10 over the first electrode 11 using a known method.

Thereafter, a process step of staking the ferritin protein 22 onto the sealing layer 10 by transferring the ferritin proteins 22 containing the respective quantum dots 21 from a PBLH film 24 onto the surface of the sealing layer 10, as disclosed in the first embodiment, is repeated, and the red light-emitting layer 13R and the green light-emitting layer 13G are individually stacked onto the sealing layer 10 sequentially.

Modification of Second Embodiment

Further, although the second embodiment has disclosed a configuration where all the red light-emitting layer 13R, green light-emitting layer 13G, and blue light-emitting layer 13B include the ferritin protein 22, in another embodiment, any of the red light-emitting layer 13R, green light-emitting layer 13G and blue light-emitting layer 13B may be a light-emitting layer 13 including the ferritin protein 22 containing the quantum dot 21. For instance, in the second embodiment, a replacement of the blue light-emitting layer 13B including the ferritin protein 22 with a blue light-emitting layer including an organic compound that emits blue light through electric-field light emission, like one typically used in the field of organic electro-luminescence diodes (OLEDs, organic light-emitting diodes), is also included in the technical scope of the disclosure.

The disclosure is not limited to the foregoing embodiments and can be modified in various manners within the scope of the claims; moreover, an embodiment that is obtained by combining, as appropriate, the technical means disclosed in the respective embodiments is also included in the technical scope of the disclosure. Furthermore, combining the technical means disclosed in the respective embodiments can form a new technical feature.

The invention claimed is:

1. A light-emitting element comprising at least one light-emitting layer,
   wherein the at least one light-emitting layer comprises a plurality of quantum dots covered by shells containing a ferritin.

2. The light-emitting element according to claim 1, wherein the at least one light-emitting layer contains a metal that is bivalent cationic.

3. The light-emitting element according to claim 2, wherein
   a shell, among the shells, covering one of two quantum dots of the plurality of quantum dots, and another shell, among the shells, covering another one of the two quantum dots of the plurality of quantum dots, are joined together via a bivalent cation within the metal.

4. The light-emitting element according to claim 2, wherein the metal comprises a metal element selected from Cd, Zn, Ca, and Mg.

5. The light-emitting element according to claim 1, wherein the ferritin has an inner diameter of 4 to 8 nm, inclusive.

6. The light-emitting element according to claim 1, wherein
   the at least one light-emitting layer further comprises:
   a red light-emitting layer including a portion of the plurality of quantum dots for emitting red light,
   a green light-emitting layer including another portion of the plurality of quantum dots for emitting green light, and
   a blue light-emitting layer including another portion of the plurality of quantum dots for emitting blue light, and
   wherein the ferritin contained in the red light-emitting layer has an inner diameter larger than at least one of an inner diameter of the ferritin contained in the green light-emitting layer and an inner diameter of the ferritin contained in the blue light-emitting layer.

7. The light-emitting element according to claim 6, wherein the inner diameter of the ferritin contained in the green light-emitting layer is larger than the inner diameter of the ferritin contained in the blue light-emitting layer.

8. The light-emitting element according to claim 6, wherein
   the plurality of quantum dots contained in the red light-emitting layer is expressed by Expression (1), and the plurality of quantum dots contained in the green light-emitting layer is expressed by Expression (2), where $0.4<x2<x1<1.0$ is satisfied:

$$Cd_{x1}Zn_{(1-x1)}Se \quad (1), \text{ and}$$

$$Cd_{x2}Zn_{(1-x2)}Se \quad (2).$$

9. The light-emitting element according to claim 6, wherein
   the plurality of quantum dots contained in the red light-emitting layer is expressed by Expression (3), and the plurality of quantum dots contained in the green light-emitting layer is expressed by Expression (4), where $0.1<x2<x1<1.0$ is satisfied:

$$Cd_{x1}Zn_{(1-x1)}Te \quad (3), \text{ and}$$

$$Cd_{x2}Zn_{(1-x2)}Te \quad (4).$$

10. The light-emitting element according to claim 6, wherein
    the plurality of quantum dots contained in the red light-emitting layer is expressed by Expression (5), and the plurality of quantum dots contained in the green light-emitting layer is expressed by Expression (6), where $0.2<x2<x1<1.0$ is satisfied:

$$CdS_{(1-x1)}Se_{x1} \quad (5), \text{ and}$$

$$CdS_{(1-x2)}Se_{x2} \quad (6).$$

11. The light-emitting element according to claim 6, wherein
    the plurality of quantum dots contained in the blue light-emitting layer is expressed by Expression (7), where $0.1<x3<0.4$ is satisfied:

$$Cd_{x3}Zn_{(1-x3)}Se \quad (7).$$

12. The light-emitting element according to claim 6, wherein
    the plurality of quantum dots contained in the blue light-emitting layer is expressed by Expression (8), where $0<x4<0.2$ is satisfied:

$$CdS_{(1-x4)}Se_{x4} \quad (8).$$

13. The light-emitting element according to claim 1, further comprising a first electrode and a second electrode disposed opposite the first electrode,
    wherein the at least one light-emitting layer is provided between the first electrode and the second electrode.

14. The light-emitting element according to claim 1, further comprising:
    a first electrode;
    a second electrode disposed opposite the first electrode; and a plurality of wavelength conversion layers,
wherein the at least one light-emitting layer is provided between the first electrode and the second electrode and further comprises a blue light-emitting layer including a portion of the plurality of quantum dots for emitting blue light, and
the plurality of wavelength conversion layers is individually disposed adjacent to the blue light-emitting layer from which the blue light exits, and converts a wavelength of the blue light emitted from the blue light-emitting layer.

15. The light-emitting element according to claim 14, wherein one of the plurality of wavelength conversion layers is one of the at least one light-emitting layer and is a red light-emitting layer including another portion of the plurality of quantum dots for emitting red light.

16. The light-emitting element according to claim 14, wherein one of the plurality of wavelength conversion layers is one of the at least one light-emitting layer and is a green light-emitting layer including another portion of the plurality of quantum dots for emitting green light.

* * * * *